(12) United States Patent
Pineda (10) Patent No.: US 10,903,590 B2
(45) Date of Patent: Jan. 26, 2021

(54) DUAL IN-LINE MEMORY MODULE (DIMM) CONNECTOR RETENTION APPARATUS

(71) Applicant: VIAVI SOLUTIONS INC., San Jose, CA (US)

(72) Inventor: June Bonifacio Pineda, San Jose, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 301 days.

(21) Appl. No.: 15/863,756

(22) Filed: Jan. 5, 2018

(65) Prior Publication Data

US 2019/0214750 A1 Jul. 11, 2019

(51) Int. Cl.

| | |
|---|---|
| *H01R 12/70* | (2011.01) |
| *H01R 12/73* | (2011.01) |
| *H01R 13/621* | (2006.01) |
| *H01R 13/627* | (2006.01) |
| *H01R 43/18* | (2006.01) |
| *H01R 43/26* | (2006.01) |

(Continued)

(52) U.S. Cl.
CPC ....... *H01R 12/7023* (2013.01); *H01R 13/621* (2013.01); *H01R 13/6273* (2013.01); *H01R 13/639* (2013.01); *H01R 43/18* (2013.01); *H01R 43/26* (2013.01); *H01R 12/721* (2013.01); *H01R 12/737* (2013.01); *H05K 7/1407* (2013.01)

(58) Field of Classification Search
CPC ............ H01R 12/7005; H01R 12/7029; H01R 12/7047; H01R 12/716; H01R 12/72; H01R 12/721; H01R 12/737; H01R 13/621; H01R 13/6215; H01R 13/6271; H01R 13/6273; H01R 13/629; H01R 13/62905; H01R 13/62911; H01R 13/62927; H01R 13/62955; H01R 13/631; H01R 13/639; H01R 43/18; H01R 43/205; H01R 43/26; H05K 7/1404; H05K 7/1407; H05K 7/1417

See application file for complete search history.

(56) References Cited

U.S. PATENT DOCUMENTS

| | | | |
|---|---|---|---|
| 6,821,149 B2* | 11/2004 | Lai ..................... | H01R 23/6873 439/607.31 |
| 8,403,689 B2* | 3/2013 | Li ........................ | H01R 12/721 439/160 |
| 2011/0286179 A1* | 11/2011 | Motschman ........ | H01L 23/4093 361/679.54 |

* cited by examiner

*Primary Examiner* — Peter Dungba Vo
*Assistant Examiner* — Joshua D Anderson
(74) *Attorney, Agent, or Firm* — Mannava & Kang, P.C.

(57) ABSTRACT

A memory connector retention apparatus is disclosed. The memory connector retention apparatus may comprise a retention body having a top portion, a bottom portion, two side portions, an end portion, and a fastening portion. In an example, the top portion and the bottom portion may be open, forming a cavity in the retention body to allow a memory connector and a memory module to be positioned within the retention body. The fastening portion may allow the retention body to secure the memory module within the memory connector by keeping memory snap arms of the memory connector fixed in a closed configuration when the fastening portion is in a tightened position. In an example, the fastening portion may comprise a hole such that a tightening element, e.g., a screw or peg, may fit into the hole. In this case, the tightening element may be adjustable so that the retention body may fit over the memory snap arms and prevent the memory snap arms at the end portion and the fastening portion of the retention body from moving into an open position.

17 Claims, 5 Drawing Sheets

(51) Int. Cl.
  *H01R 13/639* (2006.01)
  *H01R 12/72* (2011.01)
  *H05K 7/14* (2006.01)

DUAL IN-LINE MEMORY MODULE (DIMM) CONNECTOR RETENTION APPARATUS

BACKGROUND

Electronic devices, such as computers and mobile devices, are becoming more and more widespread. Personal computers, workstations, servers, and many other computing devices generally employ a base circuit board, often referred to as a motherboard or backplane. A motherboard typically includes a number of industry standard connectors mounted on its surface and a number of industry standard connectors to mechanically and electronically receive various modules or expansion cards. These industry standard connectors may be memory connectors that are intended to receive and keep modules or expansion cards, such as dual in-line memory module (DIMM), in place on the motherboard. Because such electronic devices are becoming increasingly mobile, sudden or constant movement is not uncommon. However, such movement, even the slightest jostling, may cause these memory connectors to malfunction or open up, which may dislodge or release the DIMM from the motherboard. This may result in failure or damage to the DIMM, the motherboard, or entire electronic device.

BRIEF DESCRIPTION OF DRAWINGS

Features of the present disclosure are illustrated by way of examples shown in the following figures. In the following figures, like numerals indicate like elements, in which.

DETAILED DESCRIPTION

For simplicity and illustrative purposes, the present disclosure is described by referring mainly to examples thereof. In the following description, numerous specific details are set forth in order to provide a thorough understanding of the present disclosure. It will be readily apparent, however, that the present disclosure may be practiced without limitation to these specific details. In other instances, some methods and structures have not been described in detail so as not to unnecessarily obscure the present disclosure. Throughout the present disclosure, the terms "a" and "an" are intended to denote at least one of a particular element. As used herein, the term "includes" means includes but not limited to, and the term "including" means including but not limited to. The term "based on" means based at least in part on.

A motherboard typically includes a number of industry standard connectors mounted on its surface to mechanically and electronically receive various modules or expansion cards. These industry standard connectors may be memory connectors. However, these memory connectors do not always properly receive and retain memory modules or expansion cards, such as dual in-line memory module (DIMM), in place on the motherboard. Sudden or continuous movement can cause these memory connectors to malfunction or open up. This may dislodge or release the DIMM from the motherboard, resulting in inoperability of or further damage to the DIMM, the memory connector, or the motherboard (e.g., if the DIMM is dislodged and continuously thrown about within in an electronic device). Installing a new memory connector to the motherboard may temporarily solve the problem. However, even good, non-malfunctioning memory connectors still open up within an electronic device, especially with sudden or constant movement. Furthermore, a new replacement memory connector may be costly, and the entire process of removing and installing a new memory connector, which may include opening up the entire electronic device or taking out the motherboard, may be exceedingly cumbersome and inefficient.

A memory connector retention apparatus, as described herein, may provide more secure retention of a memory module or expansion card, e.g., DIMM, to existing industry standard memory connectors on a motherboard without costly replacement or inefficient reinstallation. The memory connector retention apparatus, as described herein, may be employed on fully effective or on malfunctioning/defective memory connectors alike, to secure a memory module or expansion card on motherboard so that such connectors can better withstand sudden, abrupt, or continuous movement.

Figure 1A:
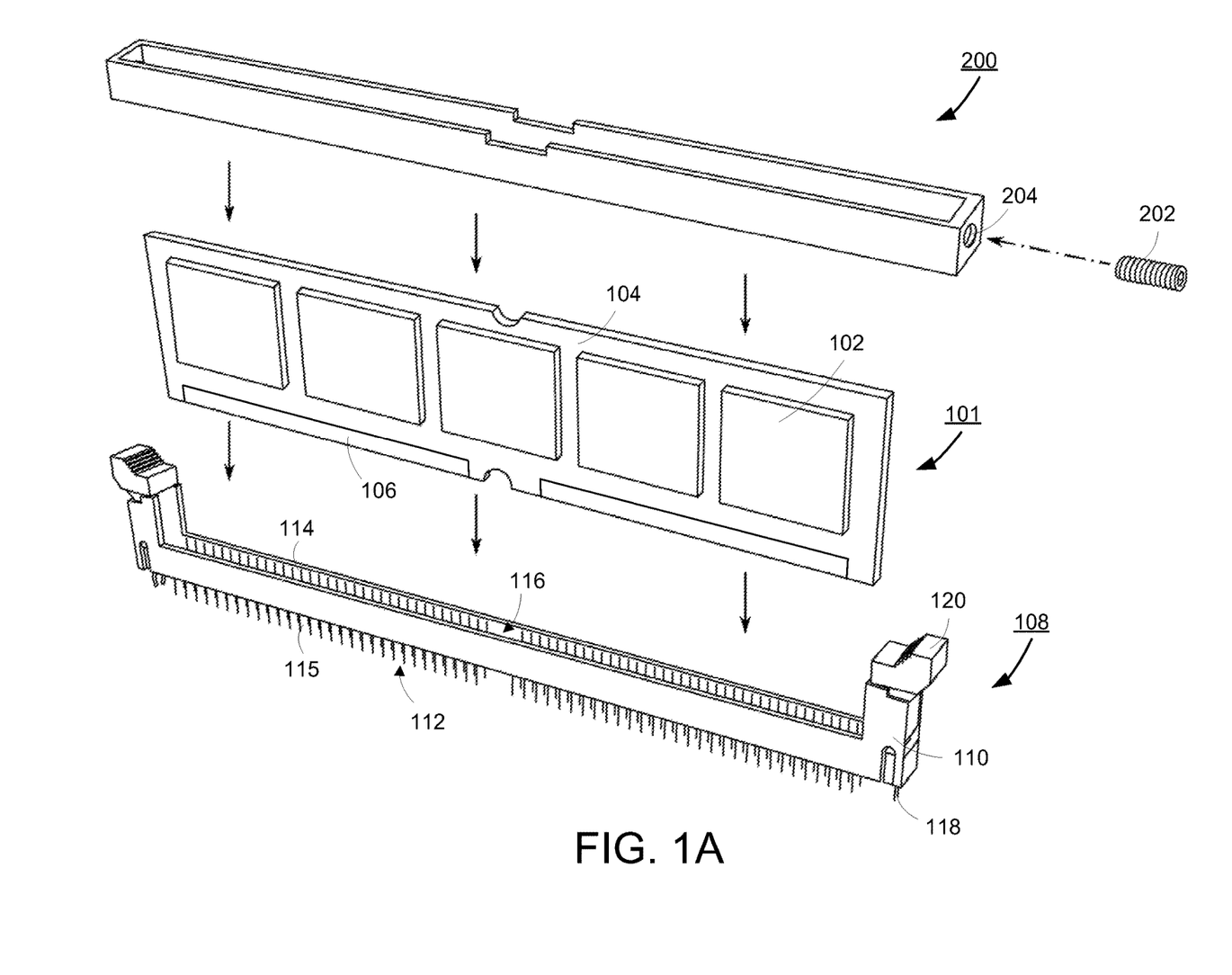
FIGS. 1A-1E illustrate a memory connector retention apparatus, according to an example.

FIGS. 1A-1E illustrate a memory connector retention apparatus 200, according to an example. As shown in FIG. 1A, an industry standard type of memory module or expansion card 101, such as a dual in-line memory module (DIMM), may include a series of dynamic random-access memory (DRAM) integrated circuits 102 mounted on a printed circuit board (PCB) 104. The memory module or expansion card 101 may comprise electrical contacts 106 coupled to the integrated circuits 102 by conductive paths on the PCB 104. These conductive paths may be spaced in a standard arrangement along an edge of the memory module or expansion card 101 for mating with respective conductive terminals of a memory connector 108, which may be any industry standard memory connector. The electrical contacts 106 may be located on both sides of the PCB 104 for mating with two separate rows of conductive terminals in the DIMM connector 108. The DIMM connector 108 may also be an industry standard connector for removable coupling of DIMMs 101 to a base printed circuit board (PCB) such as a motherboard.

The memory connector 108 may include a connector body 110 and a number of conductive terminals 112 that extend through the connector body 110. Each of the conductive terminals 112 may include a mating portion 114 and a solder portion 115. The mating portions may be arranged inside a slot 116 of the connector body 110 to contact a corresponding electrical contact 106 of a DIMM 101. Industry standard DIMM connectors may include separate sets of contacts arranged on each side of the slot 116 for providing an electrical interface between corresponding contacts on two sides of a DIMM 101.

The memory connector 108 may be temporarily or permanently coupled to a base PCB, such as a motherboard. This may be achieved by soldering the solder portion 115 of each of the conductive terminals 112 of the memory connector 108 to the conductive paths of the motherboard. The memory connector 108 may also be coupled to a motherboard by mechanical attachment, such as snap arms 118 or other similar mechanical fasteners. This mechanical attachment is intended to secure the memory connector 108 on a surface of the motherboard and relieves strain from solder joints that couple the solder portions 115 of the conductive terminals 112 to conductive paths of the motherboard.

As described above, the memory connector 108, however, may not always function as intended to secure the memory module 101 in place. For example, memory snap arms 120 may malfunction or be loosened. When this occurs, the memory module 101 may be dislodged from the memory connector 108, and all or partial electrical contact may be lost. This may render an electronic device inoperable or cause further damage. As shown in FIG. 1A, a memory connector retention apparatus 200 may be used to better secure the memory module 101 with the memory connector 108.

The memory connector retention apparatus 200 may be fitted over the entirety of the memory module 101 and the memory connector 108. A tightening element 202, such as a screw, may inserted in a hole 204 at one side of the memory connector retention apparatus 200. For example, once the memory connector retention apparatus 200 may be fitted over the entirety of the memory module 101 and the memory connector 108, the tightening element 202 may be adjusted so that the memory snap arms 120 of the memory connector 108, whether fully functioning or defective, may be secured. In other words, when the memory connector retention apparatus 200 may be fitted over the entirety of the memory module 101 and the memory connector 108 and the tightening element 202 securely fitted in the hole 204, the memory snap arms 120 of the memory connector 108 may not be opened up. In this way, any sudden or continuous movement may keep the memory module 101 secured to the memory connector 108. If the memory module 101 needs to be removed for any reason (e.g., upgrade or replacement), the tightening element 202 may be loosened or removed from the hole 204. Once this occurs, the entire memory connector retention apparatus (either in place or in its removal) allow the memory snap arms 120 to release the memory module 101 from the memory connector 108.

As described herein, the memory connector 108 may be in an "open" or a "closed" configuration. In an open configuration, the memory snap arms 120 of the memory connector 108 may be opened to allow obstruction-free insertion or removal of the memory module 101. In a closed configuration, the memory snap arms 120 of the memory connector 108 may be closed to prevent removal of the memory module 101 if it is already inserted into the memory connector 108 or insertion of a memory module 101 if none is secure already.

Figure 1B:
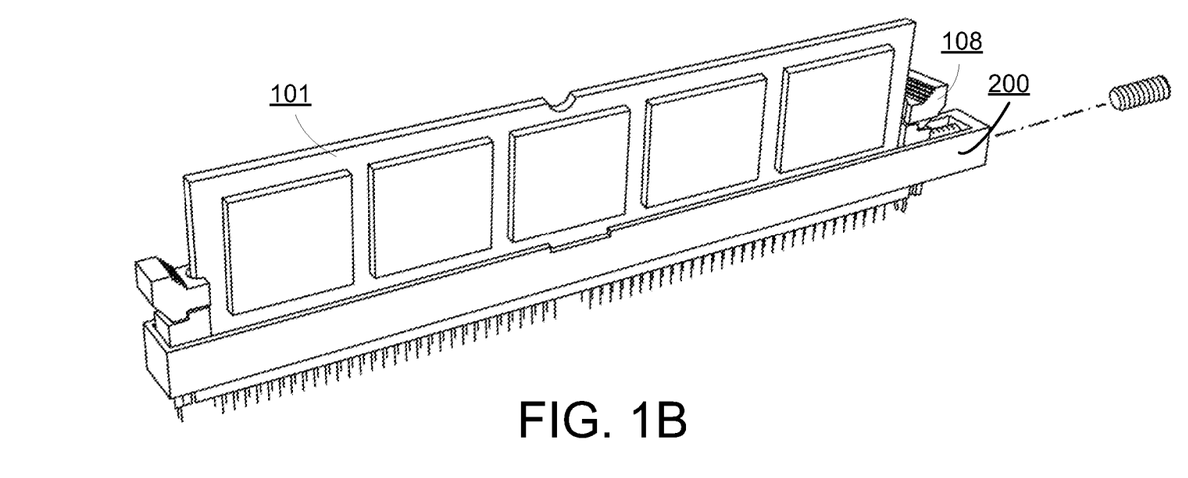
Figure 1C:
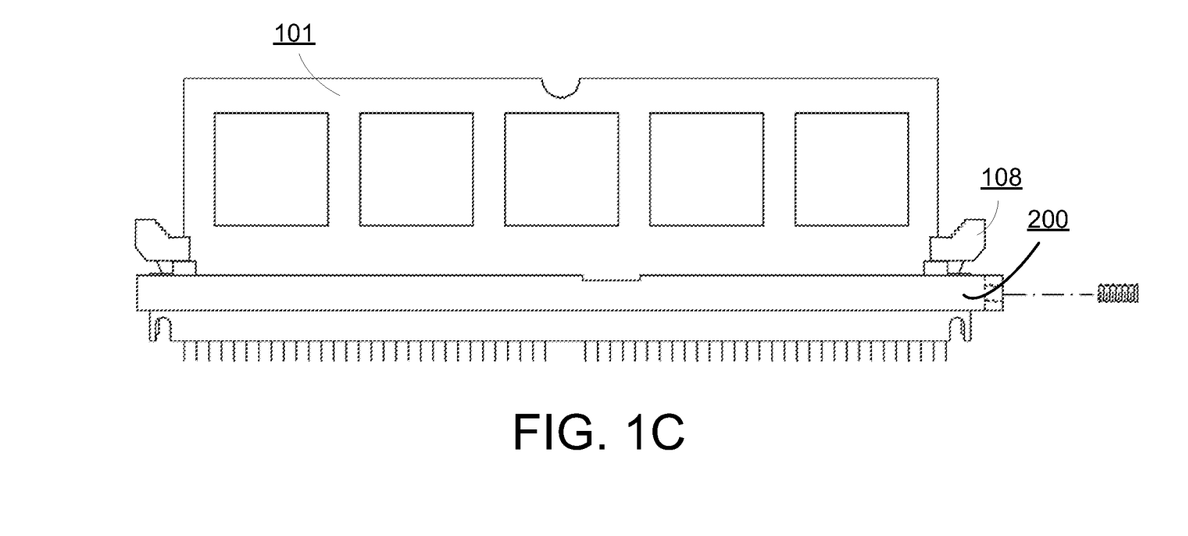
Figure 1D:
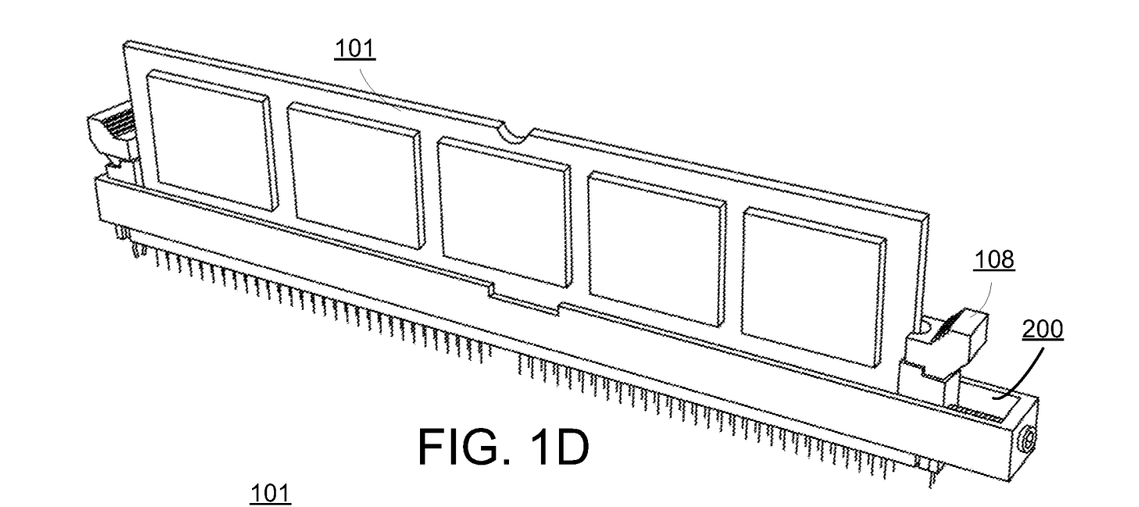
Figure 1E:
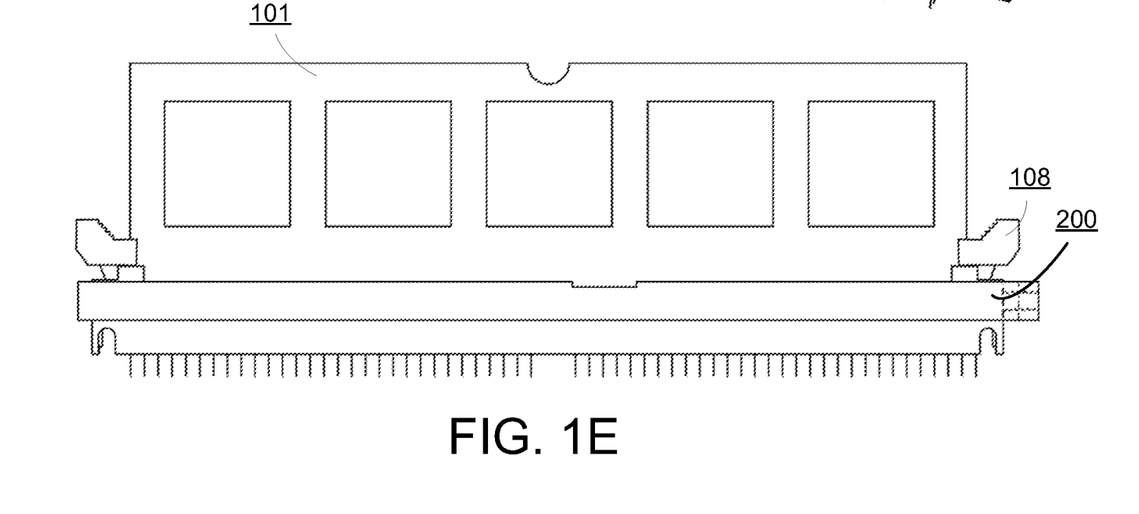

In FIGS. 1B-1D, the memory connector 108 is shown in a closed configuration where the memory module 101 is secured by the memory snap arms 120. FIG. 1B illustrates a perspective view of a memory connector retention apparatus 200 in a tightened or fastened configuration, according to an example. Here, the tightening element 202 is not yet inserted into the hole 204 to secure the memory snap arms 120 of the memory connector 108. FIG. 1C illustrates a frontal view of a memory connector retention apparatus 200 of FIG. 1B. FIG. 1D illustrates a perspective view of a memory connector retention apparatus 200 in a tightened or fastened configuration, according to an example. Here, the tightening element 202 is inserted into the hole 204 to secure the memory snap arms 120 of the memory connector 108 in place. As depicted, the memory snap arms 120 may not be moved into an open configuration until the tightening element 202 is removed or the entire memory connector retention apparatus 200 is removed entirely. FIG. 1E illustrates a frontal view of a memory connector retention apparatus 200 in a tightened or fastened configuration of FIG. 1D.

Figure 2A:
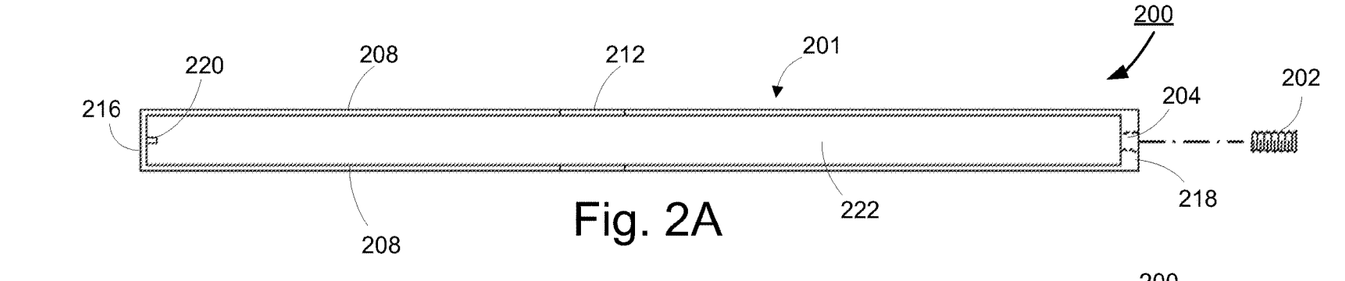
FIGS. 2A-2E illustrate a memory connector retention apparatus, according to an example.

FIGS. 2A-2E illustrate a memory connector retention apparatus 200, according to an example. FIG. 2A illustrates a top view of a memory connector retention apparatus 200, according to an example. In this view, the memory connector retention apparatus 200 may have a retention body 201, two side portions 208, an end portion 216, and a fastening portion 218, all of which may form a cavity 222 in the middle of the retention body 201. The cavity 222 may allow a memory connector 108 and a memory module 101 to be positioned within the retention body 201. In the top view, there may be a notch 212 at a top center of each of the side portions 208. The notch 212 may indicate orientation of the retention body 201. For example, the side the notch 212 resides may indicate that that side is the top side of the retention body 201. Other indicators may be used. For instance, any number of color, texture, material, or other marking may be used to show orientation of the retention body 201.

The end portion 216 may include a tongue 220 that runs the direction of the cavity 222, e.g., from the top portion to bottom portion. The tongue 220 may allow the retention body 201 to have minimum contact against the memory snap arms when the fastening portion is in a closed configuration. The fastening portion 218 may be adjustable so that it may envelope and keep memory snap arms at the end portion and the fastening portion in a closed configuration. The fastening portion 218 may include a hole 204 where a tightening element 202 may be inserted. In an example, the tightening element 202 may be a screw and the hole 204 may be threaded to receive the screw. Here, the screw may adjustable within the hole 204 to increase or decrease a tightness or security level of the retention body 201 of the memory connector retention apparatus 200 around the memory connector 108.

Figure 2B:
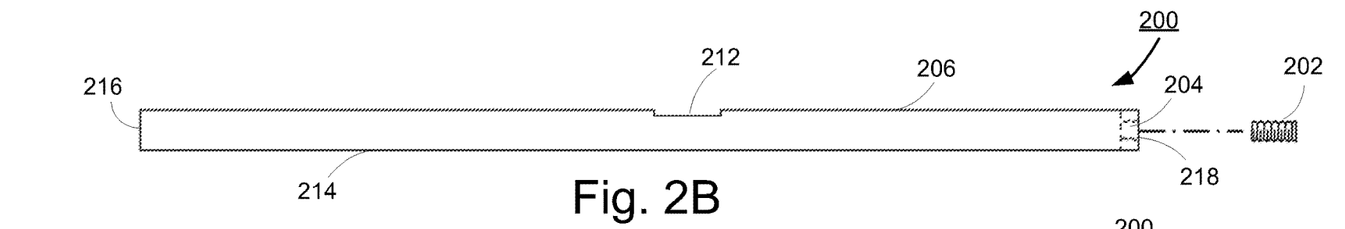

FIG. 2B illustrates a side view of a memory connector retention apparatus 200, according to an example. In this view, the memory connector retention apparatus 200 may include a top portion 206 and a bottom portion 214. The notch 212 may be at or near a center of the top portion 206 of the retention body. Although a notch 212 is used to indicate orientation (e.g., the top side), other variations may also be provided. For example, a different type of notch may be used, or a notch may be placed at the bottom portion 214 instead. In another example, a non-notch indicator may be used, such as color, material, or texture to indicate a particular orientation.

Figure 2C:
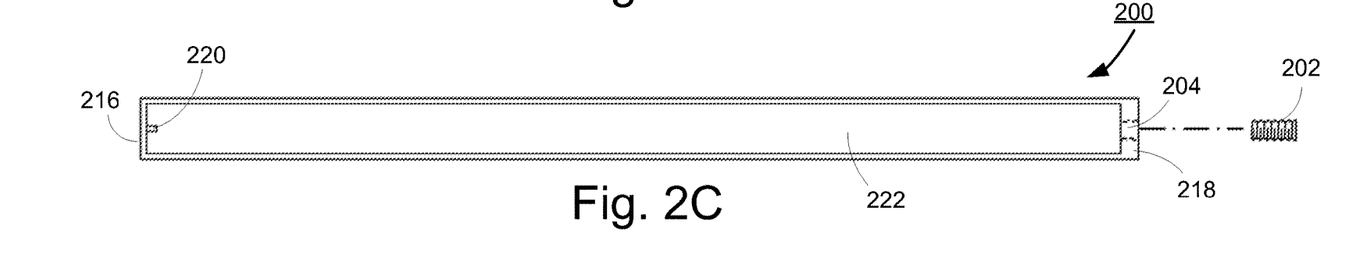

FIG. 2C illustrates a bottom view of a memory connector retention apparatus 200, according to an example. In this view, there is no notch at the bottom portion 214. But as described above, there may be other indicators to show orientation. Also in this view, the tongue 220 may be seen in the end portion 216. In an example, the tongue 220 may help the retention body to have some targeted contact against the memory snap arms when the fastening portion is in a closed configuration. It should be appreciated that while a tongue is depicted, other variations may also be provided. For example, there may be no tongue, a wider tongue to create more contact with the memory connector, or a cushioning material to allow greater elasticity during tightening at the fastening portion 218, which may minimize breakage or enhance grip.

Figure 2D:
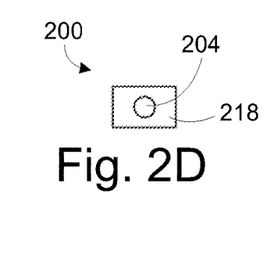

FIG. 2D illustrates a view of a fastening portion of a memory connector retention apparatus 200, according to an example. In this view, the fastening portion 218 may include a hole 204 to receive a tightening element 202. In some examples, the tightening element 202 may be a screw. The hole 204 and screw may be threaded so that adjustment (tighten or loosen) may be made. In other examples, the tightening element 202 may be a peg that fits within the hole. The peg may be adjusted in the hole 204 by pushing or pulling, and there may be friction caused by the peg and the walls of the hole 204 to allow for adjustment. The tightening element 202 may be made of various materials, such as metal, plastic, rubber, or other material (e.g., fluid, epoxy, etc.). In some examples, a material that does not easily shrink or expand with temperature variations may be used. After all, the memory module 101 and memory connector 108 are typically situated on a motherboard inside a computing device that may typically generate a lot of heat during operation and may cool down significantly during transport.

It should be appreciated that while the fastening portion 218 is depicted as having a hole 204 and may use a screw or peg, other tightening or fastening mechanisms may be employed. Such mechanisms may not even require a hole at all. For example, a tightening action may be performed on the fastening portion of the retention body. In an example, the retention body may be made of malleable material, and the tightening action may comprise bending, twisting, rolling, squeezing, contouring, tightening, or a combination thereof, so that the fastening portion is in a tightened position.

Figure 2E:
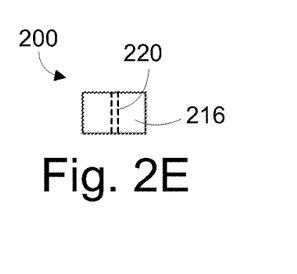

FIG. 2E illustrates a view of an end portion of a memory connector retention apparatus 200, according to an example. As described above, the tongue 220 at the end portion 216 may allow the retention body 201 to have minimum contact against the memory snap arms 120 when the fastening portion 218 is in a closed configuration.

Although the retention body 201 of the memory connector retention apparatus 200 may be made of aluminum, other various metallic materials may also be used. Other materials may also be used, such as plastic, rubber, or other moldable or bendable material that does not substantially expand or shrink with variations in temperature.

Figure 3A:
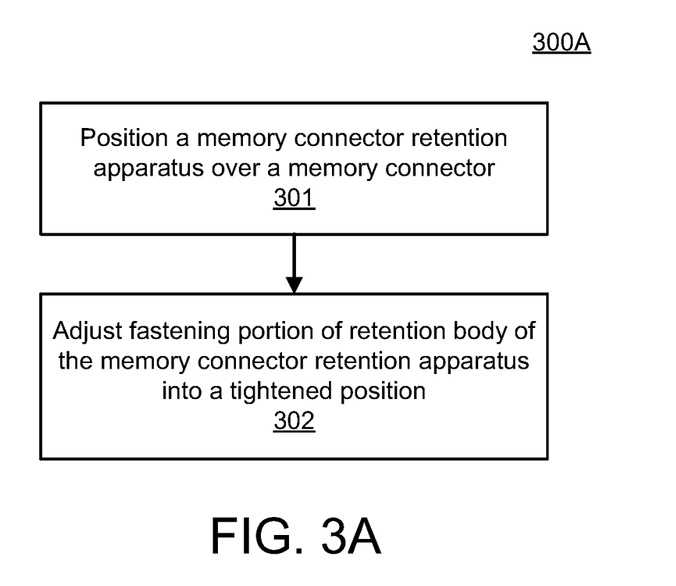
FIG. 3A illustrates a method of using a memory connector retention apparatus, according to an example.

FIG. 3A illustrates a method of using a memory connector retention apparatus 300A, according to an example. The method 300A is provided by way of example, as there may be a variety of ways to carry out the method described herein. Although the method 300A is primarily described as a way to use the memory connector retention apparatus 200 of FIGS. 1-2, the method 300A may be executed or otherwise performed to use other devices, apparatuses, systems, or combinations thereof. Each block shown in FIG. 3A may further represent one or more processes, methods, or subroutines, and functionality discussed in connection with one or more of the blocks may be implemented using and/or may include machine-readable instructions stored on a non-transitory computer readable medium and executed by a processor or other type of processing circuit to perform one or more operations described herein.

At block 301, a memory connector retention apparatus 200 may be positioned over a memory module 101 fastened within a memory connector 108. In an example, the memory connector retention apparatus 200 may comprise a retention body 201 which has a top portion 206, a bottom portion 214, two side portions 208, an end portion 216, and a fastening portion 218. The top portion 206 and the bottom portion 214 may be open, forming a cavity 222 in the retention body 201. As described herein, the cavity 222 may allow the memory connector 108 and the memory module 101 to be entirely positioned within the retention body 201.

At block 302, the fastening portion 218 of the retention body 201 may be adjusted into a tightened position. The tightened position may be a position that secures the memory module 101 within the memory connector 108. More specifically, the tightened position may cause memory snap arms 120 of the memory connector 108 to be fixed in a closed configuration. In an example, the tightened position may be achieved by fitting a tightening element 202 into a hole 204 of the fastening portion 218 of the retention body 201. The tightening element 202 may be a screw and the hole may be threaded to fit the screw. Alternatively, the tightening element 202 may be a peg that is fitted with the hole 204. In this example, the peg may be adjustable within the hole 204 using friction to hold the retention body 201 over the memory connector 108. Alternatively, adjusting the fastening portion 218 of the retention body 201 into the tightened position may not involve a screw or peg. For example, performing a tightening action on the fastening portion 218 of the retention body 201. In this case, the retention body 201 may be made of malleable material, and the tightening action may include bending, twisting, rolling, squeezing, contouring, and tightening the retention body 201 so that the fastening portion 218 is in a tightened position.

Figure 3B:
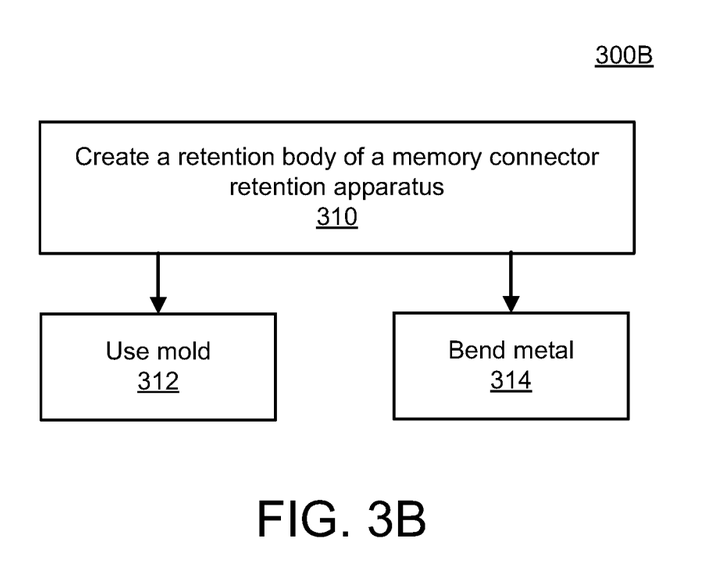
FIG. 3B illustrates a method of making a memory connector retention apparatus, according to an example.

FIG. 3B illustrates a method of making a memory connector retention apparatus 300B, according to an example. The method 300B is provided by way of example, as there may be a variety of ways to carry out the method described herein. Although the method 300B is primarily described as a way to make the memory connector retention apparatus 200 of FIGS. 1-2, the method 300B may be executed or otherwise performed to make or form other devices, apparatuses, systems, or combinations thereof. Each block shown in FIG. 3B may further represent one or more processes, methods, or subroutines, and functionality discussed in connection with one or more of the blocks may be implemented using and/or may include machine-readable instructions stored on a non-transitory computer readable medium and executed by a processor or other type of processing circuit to perform one or more operations described herein.

At block 310, a memory connector retention apparatus 200 may be made using various techniques. In an example, a memory connector retention apparatus 200 may be made by creating a retention body 201. This may include forming a top portion 206, forming a bottom portion 214, forming two side portions 208, forming an end portion 216, and forming a fastening portion 218. The top portion 206 and the bottom portion 214 may be open, forming a cavity 222 in the retention body 201. The cavity 201 may allow a memory connector 108 and a memory module 101 to be positioned within the retention body 201. The fastening portion 218 may be formed to allow the retention body 201 to secure the memory module 101 within the memory connector 108 such that memory snap arms 120 of the memory connector 108 are fixed in a closed configuration when the fastening portion 218 is in a tightened position. In one example, the retention body 201 may be created by using a mold 312 to create a solid integrated retention body 201. In another example, the retention body may be created by bending metal 314 to create a solid integrated retention body 201.

It should be appreciated that DIMMs may come in a variety of different sizes and varieties. For example, DIMMs are typically categorized by a number of pins it possesses. It should be appreciated that the memory connector retention apparatus 200, as described herein, may be employed on different sized memory connectors and corresponding DIMMs. These may include 72-pin, 100-pin, 144-pin, 168-pin, 172-pin, 184-pin, 200-pin memory connectors, or other sized memory connectors. There are also a variety memory modules or expansion cards, such as SO-DIMMS, DRAM, DDR, DDR2, DDR3, DDR4, SPD EEPROM, etc., all of which may be provided in different sizes or pin numbers as well. Accordingly, Although examples directed to DIMM, the memory connector retention apparatus 200, as described herein, may be employed on any or all of industry standard memory connectors for any or all of these memory sizes and varieties.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

The invention claimed is:

1. A memory connector retention apparatus comprising:
   a retention body comprising a top portion, a bottom portion, two side portions, an end portion, and a fastening portion, wherein:
   the top portion and the bottom portion are open, forming a cavity in the retention body, wherein the cavity allows a memory connector and a memory module to be positioned within the retention body, and
   the fastening portion allows the retention body to secure the memory module within the memory connector such that memory snap arms of the memory connector are fixed in a closed configuration within the cavity when the fastening portion is in a tightened position, wherein the fastening portion comprises a tightening element that is adjustable to fit and secure the retention body over the memory snap arms and prevent the memory snap arms at the end portion and the fastening portion of the retention body from moving into an open position, wherein the tightening element comprises at least one of a peg and a screw.

2. The memory connector retention apparatus of claim 1, wherein
   the fastening portion of the retention body comprises a hole.

3. The memory connector retention apparatus of claim 2, wherein:
   tightening element fits into the hole of the fastening portion of the retention body.

4. The memory connector retention apparatus of claim 3, wherein the hole is threaded to fit the screw, such that the screw is adjustable within the hole to determine level of security of the retention body over the memory connector.

5. The memory connector retention apparatus of claim 3, wherein the peg that is fitted with the hole, such that the peg or pin is adjustable within the hole to determine level of security of the retention body over the memory connector.

6. The memory connector retention apparatus of claim 5, wherein the peg uses friction to tighten against walls of the hole of the fastening portion of the retention body.

7. The memory connector retention apparatus of claim 3, wherein the tightening element is made of at least one of metal, plastic, rubber, and epoxy.

8. The memory connector retention apparatus of claim 1, wherein the retention body is made of at least one of metal, plastic, and rubber.

9. The memory connector retention apparatus of claim 1, wherein the retention body is made of aluminum.

10. The memory connector retention apparatus of claim 1, wherein the fastening portion of the retention body is malleable, allowing the fastening portion to at least one of bend, twist, roll, contoured, and tightened, so that the fastening portion is in the tightened position.

11. The memory connector retention apparatus of claim 1, wherein the two side portions each contain a notch at the top portion of the retention body, the notch in each of the side portions to indicate orientation of the retention body for fitting over the memory connector and the memory module.

12. The memory connector retention apparatus of claim 1, wherein the end portion comprises a tongue that runs in a direction from the top portion to the bottom portion, wherein the tongue allows the retention body to have minimum contact against the memory snap arms when the fastening portion is in the closed configuration.

13. A method of using a memory connector retention apparatus comprising:
   positioning a memory connector retention apparatus over a memory module fastened within a memory connector, wherein the memory connector retention apparatus comprises a retention body comprising a top portion, a bottom portion, two side portions, an end portion, and a fastening portion, where
   the top portion and the bottom portion are open, forming a cavity in the retention body, wherein the cavity allows the memory connector and the memory module to be entirely positioned within the retention body; and
   adjusting the fastening portion of the retention body into a tightened position, thereby securing the memory module within the memory connector, wherein the tightened position causes memory snap arms of the memory connector to be fixed in a closed configuration within the cavity, wherein the fastening portion comprises a tightening element that is adjustable to fit and secure the retention body over the memory snap arms and prevent the memory snap arms at the end portion and the fastening portion of the retention body from moving into an open position, wherein the tightening element comprises at least one of a peg and a screw.

14. The method of claim 13, wherein adjusting the fastening portion of the retention body into the tightened position comprises:
   fitting the tightening element into a hole of the fastening portion of the retention body.

15. The method of claim 14, wherein the tightening element is a screw and the hole is threaded to fit the screw.

16. The method of claim 14, wherein the tightening element is a peg that is fitted with the hole, such that the peg is adjustable within the hole using friction to hold the retention body over the memory connector.

17. The method of claim 13, wherein adjusting the fastening portion of the retention body into the tightened position comprises:
   performing a tightening action on the fastening portion of the retention body, wherein the retention body is made of malleable material, and wherein the tightening action comprises at least one of bending, twisting, rolling, squeezing, contouring, and tightening, so that the fastening portion is in the tightened position.

* * * * *